United States Patent [19]

Sherwood et al.

[11] Patent Number: 5,878,054

[45] Date of Patent: *Mar. 2, 1999

[54] METHOD AND APPARATUS FOR TEST DATA GENERATION

[75] Inventors: William Henry Sherwood, Sterling; Michael Kantrowitz, Worcester; David Howard Asher, Sutton, all of Mass.

[73] Assignee: Digital Equipment Corporation, Maynard, Mass.

[*] Notice: This patent issued on a continued prosecution application filed under 37 CFR 1.53(d), and is subject to the twenty year patent term provisions of 35 U.S.C. 154(a)(2).

[21] Appl. No.: 54,793

[22] Filed: Apr. 3, 1998

Related U.S. Application Data

[63] Continuation of Ser. No. 526,347, Sep. 11, 1995.
[51] Int. Cl.⁶ .................................................. G06F 11/00
[52] U.S. Cl. ............................................................ 371/27
[58] Field of Search ................................ 371/16.1, 14, 27; 395/600; 324/73 R; 364/200, 578

[56] References Cited

U.S. PATENT DOCUMENTS

| | | | |
|---|---|---|---|
| 3,345,450 | 10/1967 | Saw et al. | 371/27 |
| 4,713,758 | 12/1987 | De Kelzita et al. | 364/200 |
| 4,736,375 | 4/1988 | Tannhauser et al. | 371/27 |
| 5,303,367 | 4/1994 | Leenstra, Sr. et al. | 395/600 |
| 5,359,546 | 10/1994 | Hayes et al. | 364/579 |
| 5,488,573 | 1/1996 | Brown et al. | 364/578 |
| 5,629,878 | 5/1997 | Robrosly | 364/579 |

*Primary Examiner*—Vincent P. Canney

[57] ABSTRACT

A method and apparatus for generating test data is presented. A data generator produces data using element specifications contained in an input script. The data generator includes a specification analyzer and data synthesizer. The data generator produces the data that includes varied combinations of the element specification generated in a particular order. Both the combination and the particular order in the generated sequence may vary in accordance with a specified method of data generation. Three methods of data generation—carry-out method, grey code method, and all-change method—are described.

21 Claims, 9 Drawing Sheets

METHOD AND APPARATUS FOR TEST DATA GENERATION

This is a continuation of copending application Ser. No. 08/526,347, filed on Sep. 11, 1995.

BACKGROUND OF THE INVENTION

This invention relates generally to computer systems, and more particularly to methods of test data generation in a computer system.

As it is known in the art, testing, particularly as applied to computer hardware and software, is an ongoing task in development and maintenance activities which requires a large portion of time, computer and human resources, and effort. Software development may include the development of an entirely new application or program, or the addition of a new feature to an existing application. Software maintenance activities generally include the correction of reported problems. Similarly, for example, hardware development may include the development of a new computer chip, or an improvement to an existing computer chip.

Testing is typically performed to verify proper functioning of new hardware and software, as well as to verify correctness of a modification or an improvement to existing hardware and software.

Typically, data, such as test data, is used as an input during testing of hardware and software to provide, for example, sample inputs of real-time conditions under which the hardware or software functions to enable problem detection and resolution. During testing, a developer or maintainer typically attempts to debug hardware or software by detecting and solving problems associated with a product prior to the product, for example, reaching a user or customer.

Generally, as the complexity of hardware and software increases, the complexity of testing also increases. For example, as the design of a computer chip increases in complexity, the number and combination of test cases needed to ensure that each portion of the computer chip functions correctly may also increase.

Adequately and thoroughly testing hardware and software is typically an important aspect of development and maintenance. In testing, it is important that the test data provide thorough testing coverage, for example, of each component and many or all combinations of components, to adequately test combinations of the components as they may be used outside of the testing environment.

One technique used to generate test data includes manually writing each data case. For example, each data case may be manually entered into a file in a computer system using an input device such as a keyboard connected to a terminal.

This technique has several drawbacks. One drawback is that when such data entry is performed manually, it is often cumbersome and time-consuming. Also, possibility of a data entry error causing incorrect data to be entered and used, generally increases with manual data entry. Another drawback is that a human typically constructs each data case. This often results in incomplete testing coverage since a combination may easily be omitted. Particularly as the complexity of the hardware or software being tested increases, the probability that a necessary test case is omitted also increases since the various combinations of elements to be tested increases. In summary, manual data entry is typically costly, inefficient, and prone to human error.

Another method of generating test data includes using a tool, such as a software tool, to automatically generate test data. This is an improvement over the foregoing manual data entry technique since it is more efficient and less prone to human error due to the decreased requirement of human interaction. However, current tools used for this purpose have drawbacks and often lack desirable features and functions.

Generally, tools currently available use independent test data generation methods, such as 'random' and 'exhaustive', that are associated with a single input data set providing independent data element selection, i.e., select a data element from one set independently of other data elements selected from other input data sets. For example, a 'random' selection method randomly selects, using a random number generator selection algorithm, a first data element in a first input data set to be included in a generated test data case. Additionally, using a second input data set with the 'random' selection method causes a random selection of a second data element from the second input data set to be output in the same generated test data case. An 'exhaustive' method of test data generation may, for a single set, alternate through each data element. Once each data element has been selected for test data generation, selection begins again with the first data element cycling through to the last data element.

Current methods of generating data frequently produce fixed sequences of data which may also omit certain combinations of data elements in a single data case. It is desirable to have a method for generating data which does not inherently omit combinations of input data elements in its generated sequence of test cases. Furthermore, the ability to alter a sequence and produce a different ordering of test cases for the same input data elements is also desirable. Altering a sequence for a given set of test elements may provide a new additional testing perspective for the same input test elements thereby increasing test coverage without requiring respecification of input data elements.

Existing methods tend to be independent, generating test data that focuses on a single test case. Generally, thorough testing also includes using test data which coordinates a particular sequence of test cases, not just the combination of test elements in each isolated test case. For example, testing retrieval of information from a data memory cache requires a series of test cases in which a first instruction including an address is near a second instruction also including the address. Therefore, a method of generating test data which focuses on coordinating generated test data cases is desirable.

In testing hardware and software, exhaustive testing may not be possible or feasible. The method should be able to generate data that provides adequate testing coverage using an amount of generated data that can be executed in a reasonable amount of testing time.

SUMMARY OF THE INVENTION

In accordance with the present invention is a method executed in a computer system comprising the steps of ordering two or more input data sets, each data set comprising one or more data elements, associating an index with each input data set, selecting a data element from said input data sets in accordance with selection criteria, and generating an output data set comprising the data elements selected.

Further, in accordance with the invention is a memory comprising means for ordering two or more input data sets, each data set comprising one or more data elements, means for associating an index with each input data set, means for selecting a data element from said input data sets in accordance with selection criteria, and means for generating an output data set comprising the data elements selected.

With such an arrangement, automated generation of test data may proceed in a cost and time efficient manner while simultaneously increasing quality and product reliability. The arrangement is flexible so that a variety of data types may be generated for a wide range of purposes, such as testing hardware and software. Minimal user input is required to specify input elements used to automatically generate data. The flexible input specification allows a user to optimally customize the input data elements so that data generated may provide focused testing of a particular feature or function. The input specification provides a way for altering the order of test cases generated for a fixed sequence providing a second different ordering of test cases for the same input data elements.

The invention provides for generation of test data that provides thorough coverage for the input test elements by including many varied combinations of the input test elements. Additionally, the invention provides a method of generating test data that varies the position of test cases relative to one another in a generated data sequence which is important, for example, when testing a data cache.

Using the invention, test data generation may be performed efficiently with a minimal amount of associated cost and time and without imposing undue restrictions, such as restricting the types of data generated, or require excessive manual data entry for the input data elements needed for data generation.

BRIEF DESCRIPTION OF THE DRAWINGS

The above-mentioned and other features of the invention will become more apparent by reference to the following description taken in connection with the accompanying drawings in which.

DETAILED DESCRIPTION OF PREFERRED EMBODIMENTS

Figure 1:
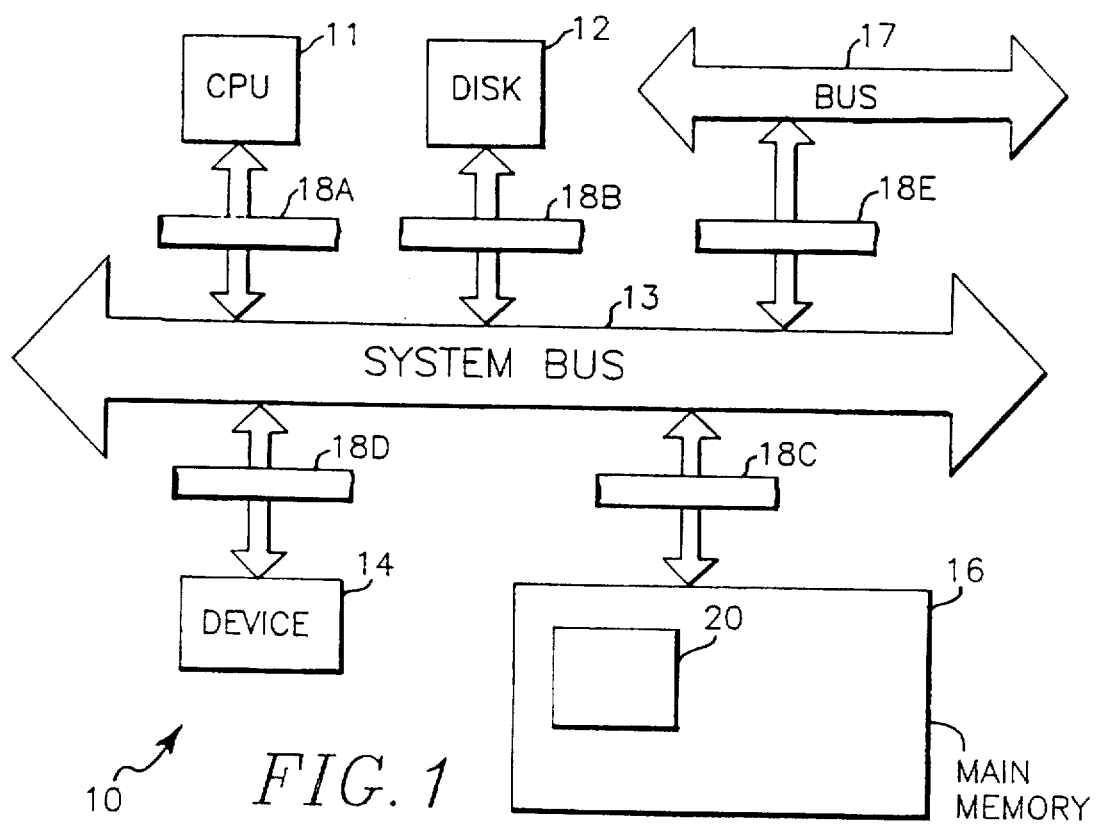
FIG. 1 is a simplified block diagram of a computer system.

Referring now to FIG. 1, a computer system 10 is shown to include a central processing unit (CPU) 11, a computer disk drive 12, a system bus (first bus) 13, another system device 14 (which may be an input device, such as a keyboard connected to a terminal), and a main memory 16 each inter-connected by system bus 13 via bus interfaces 18a–18d. A second bus 17, which may be an I/O bus or another system bus, is also connected to the system bus 13 via bus interface 18e. The CPU, disk drive, other system device, second bus and main memory communicate over the system bus 13.

Machine executable programs, such as a data generator 20 which generates test data, are loaded into main memory for execution by the CPU. A machine executable program typically contains machine instructions to be executed by the CPU which reads in the machine executable program from memory over the bus and executes the machine instructions. A data generator 20 is generally a machine executable program comprising machine instructions and is loaded into memory, for example, from a computer disk using the disk drive 12.

Figure 2:
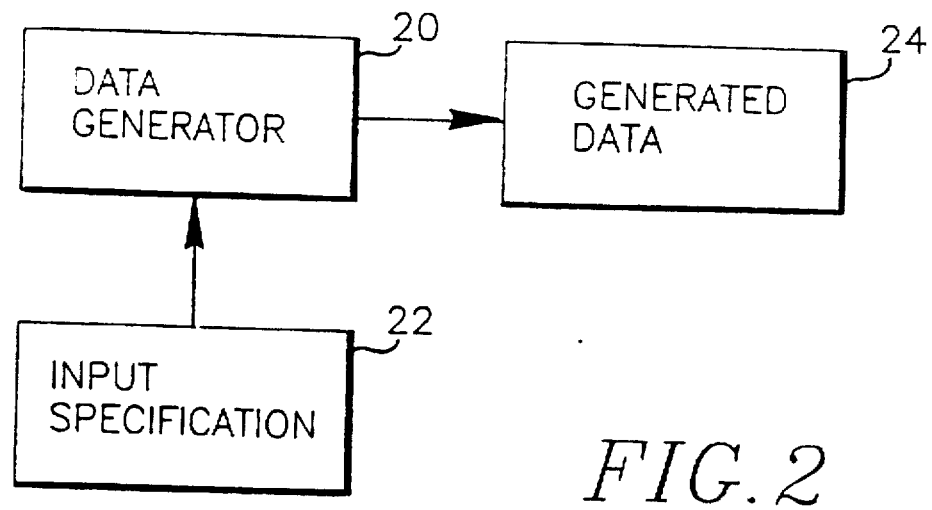
FIG. 2 is a block diagram which depicts data paths to a data generator.

Referring now to FIG. 2, an input specification 22 contains a description of data elements and is input to the data generator 20. The data generator produces data 24 comprising combinations of the data elements in accordance with the input specification. A detailed description of the data generator and the input specification are discussed in the following paragraphs.

Figure 3:
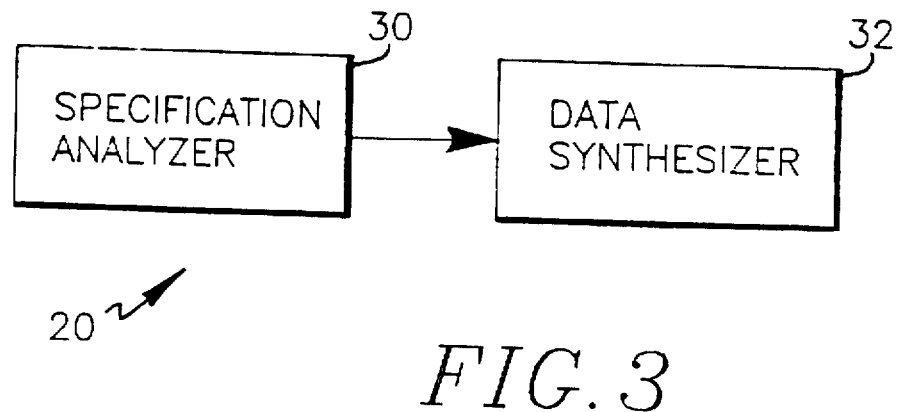
FIG. 3 is a block diagram of a first implementation of the data generator of FIG. 1.
Figure 3A:
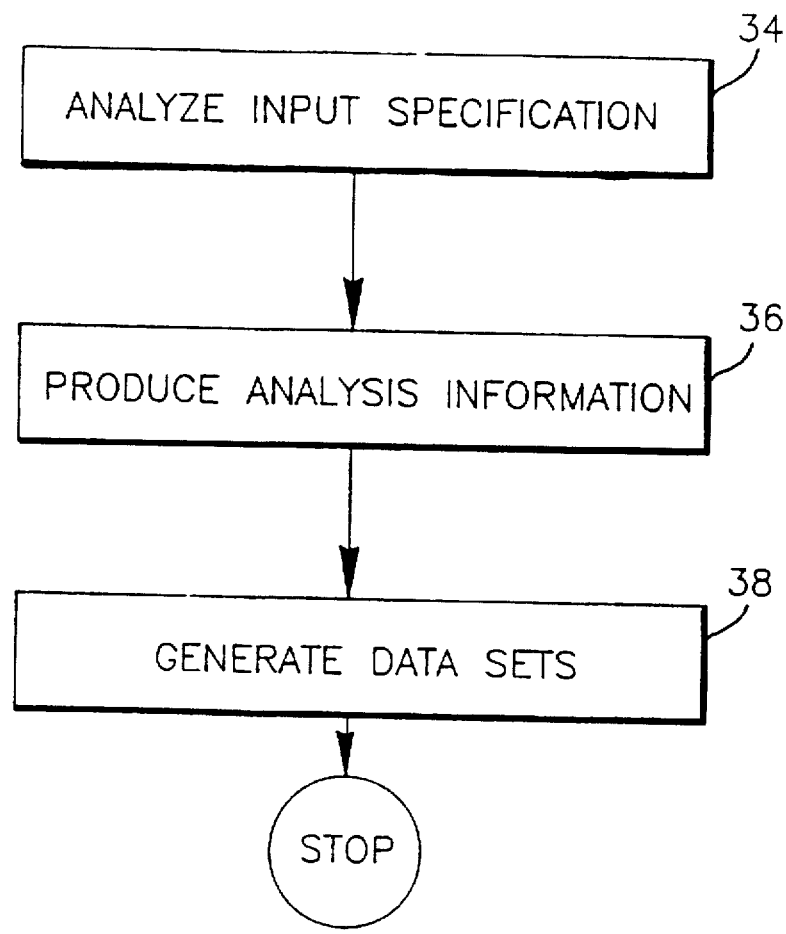
FIG. 3A is a flow chart outlining processing steps of the data generator of FIG. 3.

Referring now to FIG. 3, one implementation of a data generator 20 includes a specification analyzer 30 which analyzes an input specification generating analysis information used by a data synthesizer 32. The data synthesizer 32 uses the analysis information to produce test data. As shown in FIG. 3A, functionally, the specification analyzer 30 analyzes (as in step 34) the input specification 22 producing analysis information (as in step 36) which is input to the data synthesizer. Using the analysis information, the data synthesizer generates (as in step 36) one or more data sets that comprise the generated data 24.

The specification analyzer and data synthesizer are typically implemented using well-known language analysis techniques found in, for example, compilers and language interpreters. Language analysis techniques, such as parsing and semantic analysis, are well-known to those of ordinary skill in the art of languages and may be used in a preferred implementation. For example, an implementation of the specification analyzer includes a recursive-descent parser performing syntactic analysis to determine the syntactical correctness of the input specification. Another implementation uses software tools, such as standard UNIX tools 'lex' and 'yacc', to process the input specification.

Generally, if the input specification is syntactically correct, semantic processing activities are typically performed. Semantic processing generally includes, for example, interpreting the input specification, and representing its interpretation in a form communicated to the data synthesizer 32. For example, if the input specification includes a language statement for defining a data element to be one of multiple data types, such as integer and string, semantic processing typically includes recording the specified type of a data element after determining that the language statement is syntactically correct. In another embodiment, another language statement specifies a particular method of data generation to be used by the data synthesizer 32.

Typically, the specification analyzer 30 represents the semantic processing information, such as the data type and the particular method to be used for data generation, in some intermediate form which is communicated to the data synthesizer 32. For example, if there are two possible data types, integer and string, a data type of 0 identifies an integer data element and a data type of 1 identifies a string data element. For a data element "ELEMENT_1", the specification analyzer provides "ELEMENT_1, 1" to the data synthesizer as parameters of a procedure call. In an alternate embodiment, the specification analyzer places the data element and its corresponding type denoted by "ELEMENT__1, 1" in a temporary file on disk with other information used by the data synthesizer. A more detailed example is given in following text.

Generally, for a particular input specification comprising one or more language statements, the specification analyzer detects syntactically invalid language statements and processes syntactically valid language statements. Semantic information regarding the syntactically valid language statements is typically communicated to the data synthesizer to enable generation of data in accordance with the input specification.

Other preferred implementations of the data generator 20 are possible and vary with each particular implementation depending on, for example, the complexity of the language of the input specification, and the particular method of parsing the language comprising the input specification.

One embodiment of the data generator 20 is a machine executable program that has been produced using source files, a compiler and a linker. Generally, the source files include statements written in a commercially available programming language, such as "C". The source files are compiled using a compiler and produce object files which are linked by a linker to produce the machine-executable program, i.e., the data generator 20.

Typically, the input specification includes definitions of data elements. The data generator generates one or more data sets each comprising a combination of the data elements. In a preferred implementation, the input specification is typically written in a language that can be analyzed by the data generator. The input specification is in, for example, a file in memory or on a disk. Alternatively, depending upon testing purposes, the input specification may also be interactively entered, such as input by a user with a keyboard or mouse connected to a terminal.

Generally, the input specification includes statements other than data element specifications. Typically, the input specification is written in a language comprising statements generally classified as definitions or non-action statements, and executable or action statements. Data element definition statements are included in the former class of statements. Executable or action statements generally include, for example, a print statement to annotate and format generated data 24. Another example of an executable statement is an invocation statement of a previous definition, such as a statement which uses the data element definitions to generate data cases.

Following is an example illustrating a sample input specification 22 and the corresponding processing of the input specification by the data generator 20. Such an input specification maybe used, for example, to generate assembly language or macro instructions used to test hardware in a computer system.

Below is an example of an input specification that is stored in a file on disk:

```
TEMPLATE INSTR =
    op_code: {'ADD', 'SUB', 'MULT', 'DIV'}
    operand_1: {'R1', 'R30', '@1000', '#123'}
    operand_2: {'R1', 'R30', '@1000', '#123'}
    dst_operand: {'R4', 'R5', '@R8', 'R0'}
ENDTEMPLATE;
CROSS_PRODUCT op_code; operand_1; operand_2; dst_operand;
```

-continued

```
PRINT 'BEGINNING cross_PRODUCT DATA GENERATION ...'
$INSTR;
REPEAT (300) <$INSTR;>
```

The above input specification comprises five (5) statements: a TEMPLATE 'INSTR' definition, a CROSS_PRODUCT statement, a PRINT statement, a $INSTR data generation statement, and a REPEAT data generation statement. These statements will now be described.

The foregoing text bounded by and including TEMPLATE/ENDTEMPLATE comprise a definition statement of a template named INSTR. In this particular input specification language, a tester defines a template, such as INSTR, to represent sample macro instructions comprising an opcode, "op_code", and three operands corresponding, respectively, to the three input data sets, "operand_1", "operand_2", and "dst_operand". Each of the input data sets comprises data elements surrounded by single quotation marks ('). For example, the input data set "op_code" comprises the four (4) data elements 'ADD', 'SUB', 'MULT', and 'DIV'.

For the first statement the specification analyzer 30 parses and interprets the TEMPLATE definition statement which defines four(4) input data sets of data elements. The input data sets are associated with the template 'INSTR'. One preferred implementation of the specification analyzer builds a template data structure for the 'INSTR' template comprising an array of data sets. Each array element corresponds to an input data set and comprises a linked list of data elements. Additionally, other fields may also exist in the template data structure that are used by the data synthesizer 32, such as, for example, an integer index field or pointer field associated with each input data set used to mark the last data element of the set output in generated data.

The template data structure may also include a data generation method field, for each input data set, also used by the data synthesizer 32 to generate the next data case. Upon initializing the template data structure, each data generation method field is initialized to a value, such as a string or numeric value, indicating a default method of data generation to be used. Additionally, a preferred implementation may also include statements allowing for identification of a particular data generation method in an input specification.

The next statement, the CROSS_PRODUCT statement, is parsed and interpreted by the specification analyzer 30. The CROSS_PRODUCT statement is also a definition statement identifying a method of data generation used when generating data with sets "op_code", "operand_1", "operand_2", and "dst_operand". Upon encountering this second statement, the specification analyzer records that a particular method is to be used with the indicated input sets. The specification analyzer, for example, records or updates a data generation field indicating the new specified method which is used by the data synthesizer 32 to generate the next data case.

The third statement, the PRINT statement, is an executable statement causing a text string identified within the single quotation marks to be output to an assigned output device, such as a file or a terminal screen. In this example, the text string "BEGINNING CROSS_PRODUCT DATA GENERATION . . . " will appear on the terminal screen.

For the third statement, the specification analyzer 20 parses and stores the text string. Since this requires output to the terminal screen or file, for example, the specification analyzer passes a pointer to the string to the data synthesizer, for example, as a routine parameter enabling the data synthesizer to output the string to the terminal screen. Control is then returned to the specification analyzer.

The fourth statement is the $INSTR data generation statement. This is an executable statement invoking the previously defined INSTR template. This data generation statement is analogous to a routine call and the previous INSTR template instruction analogous to the subroutine or function definition. In this particular input specification language, the "$" preceding the template name instructs the data generator to generate the next data set using the INSTR template.

Upon encountering the fourth statement, the specification analyzer parses and interprets the statement. This results in a function or subroutine call to a routine in the data synthesizer. The routine call typically includes, for example, a pointer to the previously built internal data structure associated with the INSTR template. The data synthesizer uses this pointer to locate the data element of each input data set to be output in the next set of generated data. For example, an implementation of the specification analyzer associates each input data set with a pointer used to mark the last data element output. Also, the specification analyzer associates with each input data set, a numeric or string value indicating a particular method of data generation, such as the method indicated by the previous CROSS_PRODUCT statement. The data synthesizer uses the pointer and the indicated method to select the next data element of an input data set to be included in a generated test data case. The data synthesizer updates the pointer to point to the data element in the current generated data set, outputs the data set, and returns control to the specification analyzer.

The fifth statement is the REPEAT executable statement. This is also a data generation statement instructing the data generator to output the next 300 test cases using the INSTR template. Upon encountering the fifth statement, the specification analyzer parses and interprets the REPEAT statement. This REPEAT statement processing is similar to the processing of the previous $INSTR statement in that it is equivalent to three-hundred (300) consecutive $INSTR statements. The specification analyzer, for example, calls a routine in the data synthesizer passing, as a routine parameter, a pointer to the INSTR template data structure. Similarly, the routine in the data synthesizer uses pointers and other data, such as a string indicating a specified method of data generation, to generate the next 300 data cases. As previously explained, the data synthesizer updates the pointers and returns control to the specification analyzer.

In a preferred implementation, the input specification generally comprises many different statements including some of those from the foregoing example. Statements, their associated syntax and semantics, and the functions performed by the data generator 20 in response to each statement may vary with implementation.

The test data generated in the previous example comprises assembly language instructions used to test the hardware and software of a computer system. The assembly language instructions produced as generated test data 24 are typically assembled by an assembler or macro language processor to produce object code. The object code is typically linked with a linker to produce a machine executable program which may be executed in the computer system 10 of FIG. 1. As is well-known in the art of computer systems, each instruction is executed by the CPU 11 which decodes the instruction into its opcode and operands. Decoding an instruction by the CPU enables certain hardware in the computer system depending on the particular opcode and operands. As such, the macro instructions comprising the generated data 24 can be used to test the hardware in a computer system.

However, using the foregoing technique of specifying data elements and data sets, many different types of data can be generated for a variety of testing purposes.

In the previous example, the input specification 22 includes a CROSS_PRODUCT statement specifying a particular method of data generation to be used for the identified input data sets. Methods of data generation that may be specified with the CROSS_PRODUCT statement will now be discussed. Specifically, three methods of data generation, the carry-out, grey-code and all-change methods, will now be described. Each method provides for automated generation of data using coordinated set selection. Coordinated set selection generates data by coordinating or examining more than one input data set. Recall, independent selection methods, such as 'random', are associated with a single input data set, not multiple data sets. Each coordinated set selection method includes selection criteria to enable selection of data elements from the input data sets.

The first method of coordinated set selection that will now be described is the carry-out method of data generation. The carry-out method uses the notion of a carry-out value from one input data set to cause an address pointer, for example, currently pointing to a first data element of another input data set, to advance to a second data element in the other input data set. Following are two versions of the carry-out method of data generation.

Figure 4:
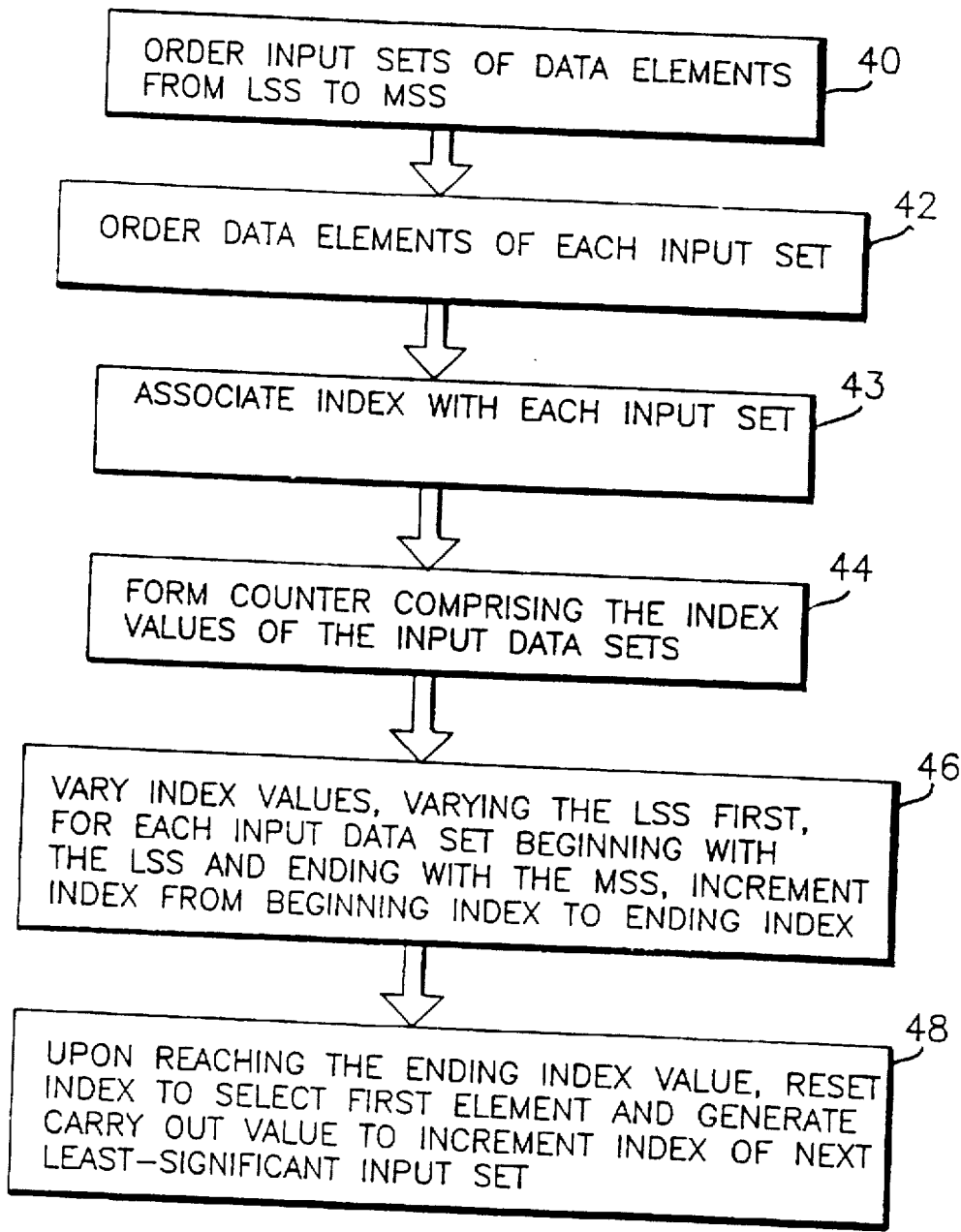
FIG. 4 is a flowchart outlining the steps for a first version of a first coordinated method (carry-out method) of data generation.

Referring now to FIG. 4, a first version of the carry-out method of data generation is described. At step 40, the input data sets are ordered (as in step 40) from a least-significant set (LSS) to a most-significant set (MSS). In step 42, the data elements comprising each input data set are ordered beginning with a first data element with a beginning index value to a last data element with an ending index value. An index is associated with each input data set, as in step 43, with each index having a value ranging from the beginning index value to the ending index value, inclusively. In step 44, an index counter is formed. The index counter comprises the index value from each of the input data sets beginning with the LSS and ending with the MSS. In step 46, the index of each input set is varied by varying, for example by incrementing, the index of the least significant input set first. For each input data set, beginning with the LSS and ending with the MSS, the corresponding input data set index is incremented from the beginning index value to the ending index value. As in step 48, upon reaching the ending index value for an input data set, the corresponding input data set index is reset to select the first element, and generate a carry-out value to increment the index of the next-least significant input set.

As the index of the LSS is repeatedly incremented, the index varies from the beginning index value to the ending index value. Upon reaching the ending index value for the LSS, a carry-out is propagated to another index associated with the next-least significant input data set. With subsequently incrementing the index of the LSS, the carry-out propagation repeats for other indices associated with input data sets of greater significance.

The selection criteria of the foregoing method includes the values of the indices corresponding to the input data sets and the carry-outs of each input data set.

The foregoing method generates a data set including the data elements corresponding to each set of indices comprising the index counter. To better illustrate the carry-out method, consider the previous sample input specification with the TEMPLATE statement. In the following example, input data sets are ordered most-significant, "op_code", to least-significant, "dst_operand". Data elements in each set are ordered 0 to 3 from left to right in each input data set. Using the carry-out method, the following are index counter values, corresponding carry-out values for each index, and the corresponding generated data set:
Sample input specification:

```
INDEX COUNTER digit position
 |
 v
        TEMPLATE INSTR =
    C₃  op_code: {'ADD', 'SUB', 'MULT', 'DIV'}
    C₂  operand_1: {'R1', 'R30', '@1000', '#123'}
    C₁  operand_2: {'R1', 'R30', '@1000', '#123'}
    C₀  dst_operand: {'R4', 'R5', '@R8', 'R0'}
        ENDTEMPLATE;
        CROSS_PRODUCT op_code; operand_1; operand_2;
            dst_operand;
    PRINT 'BEGINNING CROSS_PRODUCT DATA GENERATION ...'
    $INSTR;
    REPEAT (300) <$INSTR;>
```

Corresponding information and generated data:

| INDEX COUNTER C₃-C₀ | CARRY-OUT | GENERATED DATA SET |
|---|---|---|
| 0000 | 0000 | ADD R1 R1 R4 |
| 0001 | 0000 | ADD R1 R1 R5 |
| 0002 | 0000 | ADD R1 R1 @R8 |
| 0003 | 0001 | ADD R1 R1 R0 |
| 0010 | 0000 | ADD R1 R30 R4 |
| 0011 | 0000 | ADD R1 R30 R5 |
| 0012 | 0000 | ADD R1 R30 @R8 |
| 0013 | 0001 | ADD R1 R30 R0 |
| 0020 | 0000 | ADD R1 @1000 R4 |
| : | : | : |
| 0333 | 0111 | ADD #123 #123 R0 |
| 1000 | 0000 | SUB R1 R1 R4 |
| : | : | : |
| 3333 | 1111 | DIV #123 #123 R0 |
| 0000 | 0000 | ADD R1 R1 R4 |

When the carry-out value of a first index is 1 on an iteration, the second index of the next least significant increments by 1 on the next iteration for generating data. The first index is also reset to select the first element in the input data set, for example reset to 0.

Note that if a first index is associated with a first input data set and a second index is associated with a second more-significant input data set, the first index values vary faster than the second index values.

Alternatively, as previously described, a pointer may be associated with each input data set to identify a previous data element output in the last generated data case. The carry-out of the immediately lower-significant input data set may cause the pointer of the next most-significant input data set to advance to the next data element.

Similarly, in another preferred implementation, the input data set in the template may be implemented as an array using an integer variable index as a data element selector. The integer variable index may store the index value of the last data element included in a generated test cases. The carry-out of an immediately lower-significant input data set may cause the integer variable index of the next most-significant input data set to be incremented by 1, modulo the array size, producing an index value of the next sequential data element in the next most-significant input data set. The foregoing implementation assumes a zero-based array is used, as in the "C" programming language.

A sequence of data typically ends when the pattern of data sets generated begins to repeat itself. In the instant case with the carry-out method, the sequence ends when all the carry-out values are 1. Generally, if more data is required, such as a REPEAT statement is executed for three-hundred (300) iterations and the sequence includes, for example, twenty (20) data sets, the sequence starts over again. Thus, for example, the twenty-first (21st) data set generated would be the first element of the sequence.

Typically, an embodiment has varying features and restrictions effecting the implementation of the method steps of FIG. 4. An implementation may include features, such as conditional statements allowing for suppression of particular data elements belonging to an input data set. Therefore, the method may have to be adapted to a particular implementation.

One embodiment implements the first version of the carry-out method using a "trigger set" causing the execution of the method steps of FIG. 4. A trigger set is one of the input data sets occurring, for example, in the CROSS_PRODUCT statement of the input specification as in the previous example:

```
CROSS_PRODUCT op_code; operand_1; operand_2;
    dst_operand;
    :
$INSTR;
```

In the embodiment, the LSS, i.e., op_code, is designated as the trigger set. Upon encountering an executable statement, such as the '$INSTR' statement to generate data, the embodiment processes the input data sets in the sequential order of appearance in the CROSS_PRODUCT statement. Upon processing the LSS, the method steps of FIG. 4 are performed. Upon processing the remainder of the input data sets, i.e., operand_1, operand_2, and dst_operand, the currently designated data element of each input data set is included in the generated data case. Carry propagation, for example, is performed upon encountering the trigger set which is the LSS in this instance.

The first embodiment also does not restrict the ordering of input data sets specified in the CROSS_PRODUCT statement. The embodiment allows any ordering of the input data sets and does not require that the trigger set be the first input data set specified. The embodiment does not require that the trigger data set be specified in the statement. Therefore, the embodiment includes a technique to ensure that a different data set is generated each time and that pointers, for example, are appropriately advanced to another data element.

One embodiment uses a bit vector including one bit position for each input data set. One bit in the bit vector is uniquely associated with each input data set. All bits are initially cleared (set to zero). Upon processing an input data set, the bit in the bit vector associated with the input data set is set (set to one). When the trigger set is processed, all bits in the bit vector are cleared or reset.

The bits in the bit vector are also cleared if, upon processing an input data set, the associated bit is already set prior to processing. This condition indicates double execution or processing of an input data set without having encountered the trigger set to increment and advance to other data elements in the input data sets. Upon detecting the double execution, the embodiment performs the steps of the first version of the carry-out method as if the trigger set had been encountered to ensure that a different consecutive data set is generated.

Using a bit vector is one technique that may be used to appropriately generate a new data set in an implementation which uses the concept of a trigger set and does not require any particular ordering of input data sets. An embodiment may use other techniques.

A second version of the carry-out method of data generation will now be described. In the second version, carry propagation and selection of a data element from an input data set are performed sequentially upon processing each input data set. Generally, if an input data set has a significant position "n", upon sequentially processing the input data set, a corresponding carry-in and propagated carry-out are determined for the input data set by subsequently processing the carry-outs of input data sets with significance less than "n". Consider an example using the following input specification:

```
TEMPLATE INSTR =
    op_code: ('ADD', 'SUB', 'MULT', 'DIV')
    operand_1: {'R1', 'R30', '@1000', '#123'}
    operand_2: {'R1', 'R30', '@1000', '#123'}
    dst_operand: {'R4', 'R5', '@R8', 'R0'}
ENDTEMPLATE;
CROSS_PRODUCT op_code; operand_1; operand_2;
                 dst_operand;
    $ INSTR;
```

Processing an executable statement, such as the '$INSTR' statement, includes executing a method of data generation to select a data element from each of the input data sets 'op_code', 'operand_1', 'operand_2', and 'dst_operand'. An implementation of the second version of the carry-out method would select a data element from the input data set 'op_code', for example, by sequentially processing, or 'executing', each input data set as specified in the list of input data sets of the CROSS_PRODUCT statement. Recall that when the LSS is processed, its corresponding index is incremented. The remaining processing of LSS determines if there is a carry-out for LSS which is posted. Subsequently processing other more significant sets handles the rippling effect by repeatedly propagating any carry-out from a less-significant set to a more-significant set using a posted carry-out. Generally, this second version of the carry-out method does not process all carry-outs when the index of the LSS is incremented. Any carry-outs are 'posted' as each input data set is processed.

Below is a pseudo-code description of the second version of the carry-out method illustrated in FIGS. 4A and 4B. Note that the LSS in this example is zero (0). Sets of increasing greater significance are denoted with a higher integer constant.

```
/*
 * variable definitions
 */
n = input data set being processed or executed.
carry_in = carry_in being determined for
           input data set "n"
count = number of times LSS has had a carry-out.
        used to ensure a carry_out for an input data set
        is not repeatedly carried out for multiple FOR
        loop iterations for the same increment of the LSS
set = array of input data sets.
    Associated with each element set[j] of the set
    array are:
```

-continued

```
set.carry_out = value of 0 or 1 for carry-out
                of this position.
set.last_index = last index value for the set
set.count = value of count at last execution
i = loop control variable or counter
/*
 * method
 */
/*
 * Least significant set always has carry-in of 1
 */
if(n == 0) let carry_in = 1;
else
/*
 * if(n != 0) then determine carry-in
 * by calculating the carry-out of each position of
 * lesser significance than "n" beginning with the
 * least significant set, 0 in this example
 */
{
    for (each set[i]; 0<=i<n)
    {
    /*
     * Ensure this is only done once for this
     * iteration of the LSS being carried out.
     */
        if (count >set[i].count) then
        {
            if(i == 0) increment set[i].last_index
            else /* i!= 0 */
            {
                f(set[i-1].carry_out == 1)
                {
                /*
                 *reset carry-out since
                 *processing it
                 */
                    set[i-1].carry_out = 0
                /*
                 * propagate carry_out into
                 * set i
                 */
                    increment set[i].last_index
                        modulo no. elts in set[i]
                    /* if this carry_in to i from
                     * i-1 caused carry-out of i,
                     * then set i's carry-out
                     */
                    if(set[i].last_index == 0)
                        set[i].carry_out = 1
                }
            }/* end if-then-else i== 0 */
        }/* end if count */
    }/* end FOR loop */
    carry_in = set[n-1].carry_out
}/* end if-then-else n!=0*/
/*
 * Now we have the carry_in for set n figured out
 * and process the carry_in
 */
if(carry_in == 0)
    select (set[n].last_index);
if(carry_in == 1)
{
    set[n].last_index = (set_[n].last.index+1)modulo
                        number of elements in set n
    select(set[n].last index);
    if(n==0) increment count
    /* see if we have a carry-out of here */
    if(set[n].last_index == 0) set[n].carry_out = 1;
}
set[n].count = count /* update since any carry_outs
                        were processed so we don't
                        repeat */
```

Figure 4A:
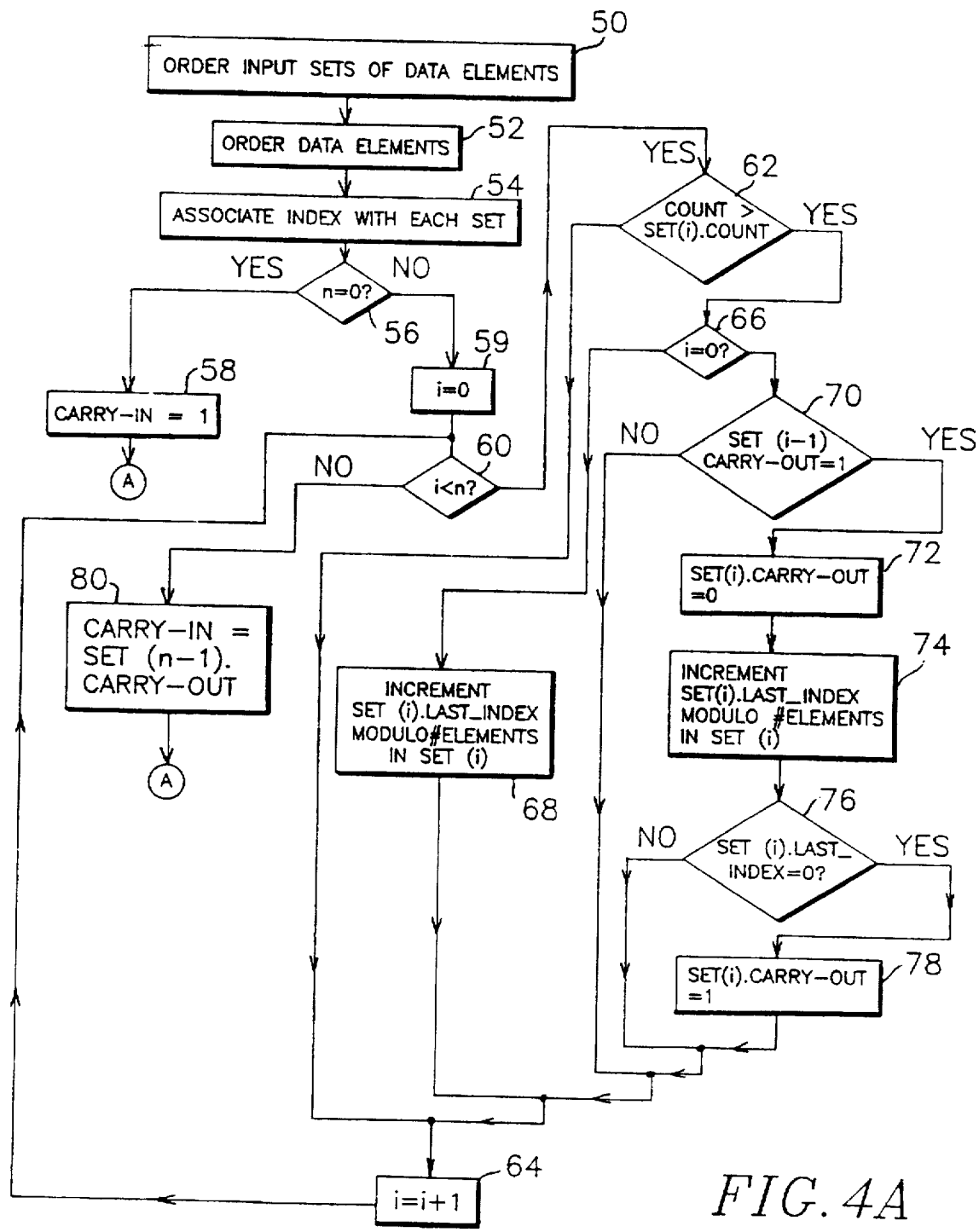
FIGS. 4A and 4B are a flowchart outlining steps for a second version of the first coordinated method (carry-out method) of data generation.
Figure 4B:
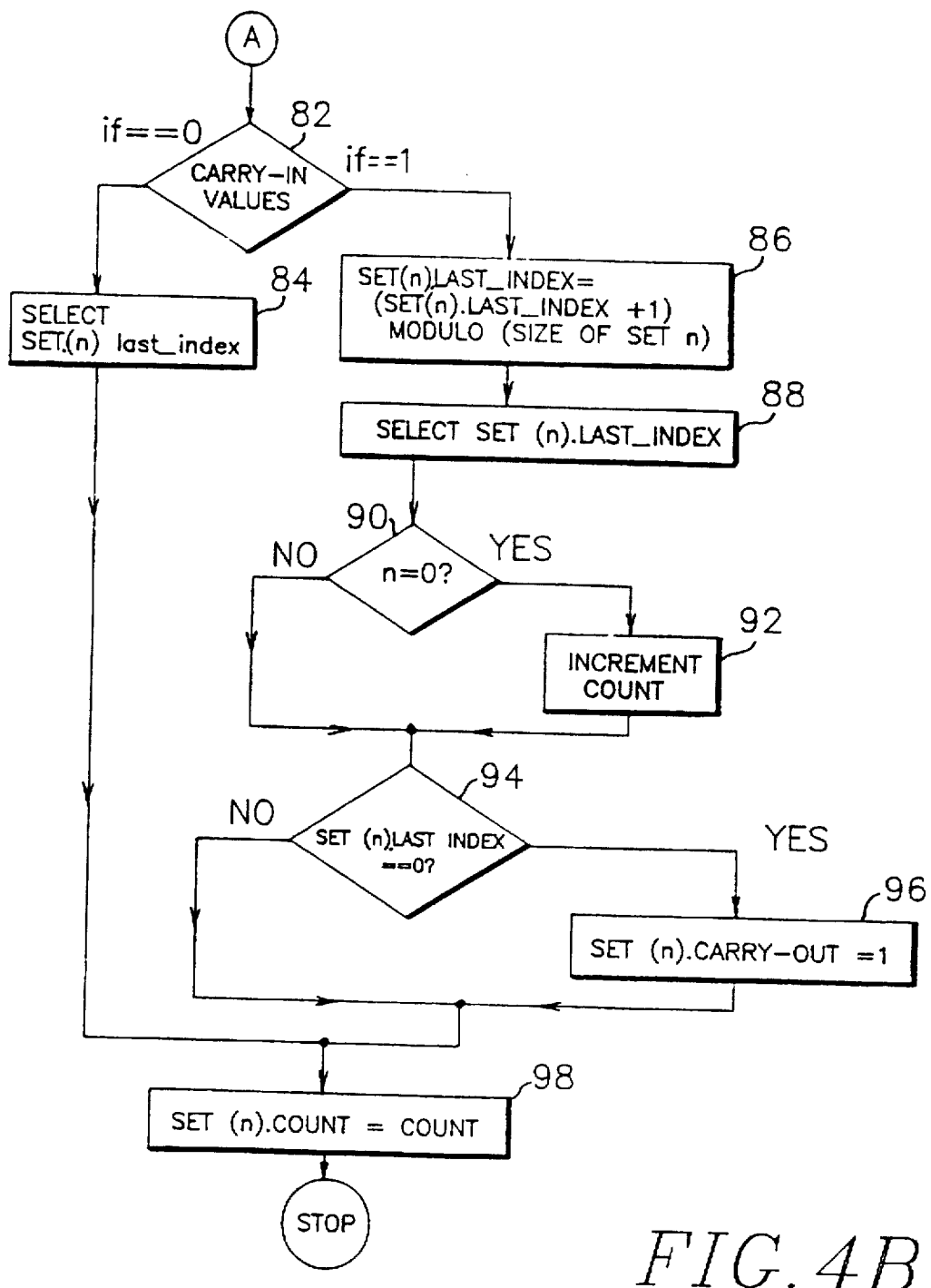

Referring now to FIGS. 4A and 4B, the second version of the carry-out method of test data generation is shown. For clarity, the variables as described above in the pseudo-code are used in FIGS. 4A and 4B. As in step 50, the input data sets are ordered from LSS to MSS. The data elements are ordered within each data set, as in step 52. In step 54, an index is associated with each input data set. A determination is made in step 56 as to whether the current set being processed or executed (referred to as set "n") is the LSS. If the LSS is being processed, in step 58 the carry-in to LSS position is set to 1.

If the LSS is not being processed, the carry-in to the "$n^{th}$" significant position is determined by examining and determining propagated carry-outs from sets of significance less that "n". A loop counter, "i", is incremented from 0 to "n" traversing each input data set of lesser significance than "n". The loop counter is initialized to 0 in step 59.

The top of the loop is at step 60 where a determination is made as to whether all sets from zero (0) to "n−1" have been traversed to determine a possible carry-out. If all sets have not been traversed, a test is made in step 62 as to whether the carry-out for this input data set has been determined. If this set has been traversed, the next input data set is examined by incrementing the loop counter "i" in step 64 which proceeds back to the top of the loop to step 60. If this set has not been traversed a determination is made at step 66 as to whether the current set being traversed in the loop is the LSS. If the LSS is the current set, in step 68 the index associated with the LSS is incremented and assigned its incremented value modulo the number of elements in the current input data set. Execution continues with step 64 proceeding to the next set of significance less than "n". If the LSS is not the current set, a determination is made at step 70 as to whether there is a carry-in to the "$n^{th}$" set position from the "n−1" set position. If there is no carry-in to the "$n^{th}$" set position, another set is examined by incrementing the loop counter as in step 64.

If a determination is made at step 70 that there is a carry-in to the "$n^{th}$" set position (which is a carry-out of the "n−1" position), in step 72 the carry-out of the "n−" position is reset to 0. The index of the current set is incremented, as in step 74, and assigned its incremented value modulo the number of data elements in the current set. A determination is made at step 76 as to whether incrementing the index of the current set results in a carry-out of the "$n^{th}$" set position. If no carry-out results, control proceeds to step 64 incrementing the loop counter and proceeding to the next input set. If a carry-out results, it is "posted", as in step 78, by setting the carry-out for the "$n^{th}$" set position. Control proceeds to step 64 incrementing the loop counter and proceeding to the next input set.

After it is determined at step 60 that sets from zero (0) to "n−1" have been traversed, the carry-in of the current "$n^{th}$" set is the carry-out of the "n−1" set, as in step 80. The carry-out of set "n−1" has just been determined by propagating any carry-outs of lesser-significant sets in the loop processing.

After the carry-in for the current set "n" has been determined, a test is performed, as in step 82, as to whether the carry-in is a zero (0) or one (1). If the carry-in is 0, the data element of set "n" indicated by the associated set index is selected, as in step 84.

If the carry-in is 1, the index associated with set "n" is incremented, as in step 86. The index is assigned the incremented value modulo the number of elements in set "n" producing, for a set of "j" elements ordered "0" to "j−1", an integer between "0" and "j−1", inclusively. The data element of set "n" indicated by the associated set index is selected, as in step 88. At step 90, a determination is made as to whether set "n" is the LSS. If set "n" is the LSS, "count" is incremented in step 92. "Count" is a variable which reflects the number of times LSS has produced a carry-out and is used to prevent, as in step 62, erroneous repeated propagation of a carry-out. At step 94, a determination is made as to whether set "n" produced a carry-out, i.e., if the associated index is 0 then a carry-out is produced. If "n " produced a carry-out, the carry-out is "posted", as in step 96, by setting a variable associated with input set "n".

After processing the carry-in values and selecting a data element from set "n", set "n" is marked by updating a variable associated with set "n" with the current value of "count", as in step 98. As previously discussed, values of "count" are used in step 62 to indicate that the carry-out for set "n" has been determined.

The second method that will now be described is the grey-code method of data generation. Generally, grey-code is a binary counting system that has no carry bits and exactly one bit changes when a value is incremented using the grey-code counting system. The basis for the grey-code method of data generation is based on the concept of having exactly one bit change when a value is incremented. The grey-code method of data generation generates data cases in which, for subsequent sequential data cases, exactly one data element included in the data case is different from the immediately preceding data case.

Figure 5:
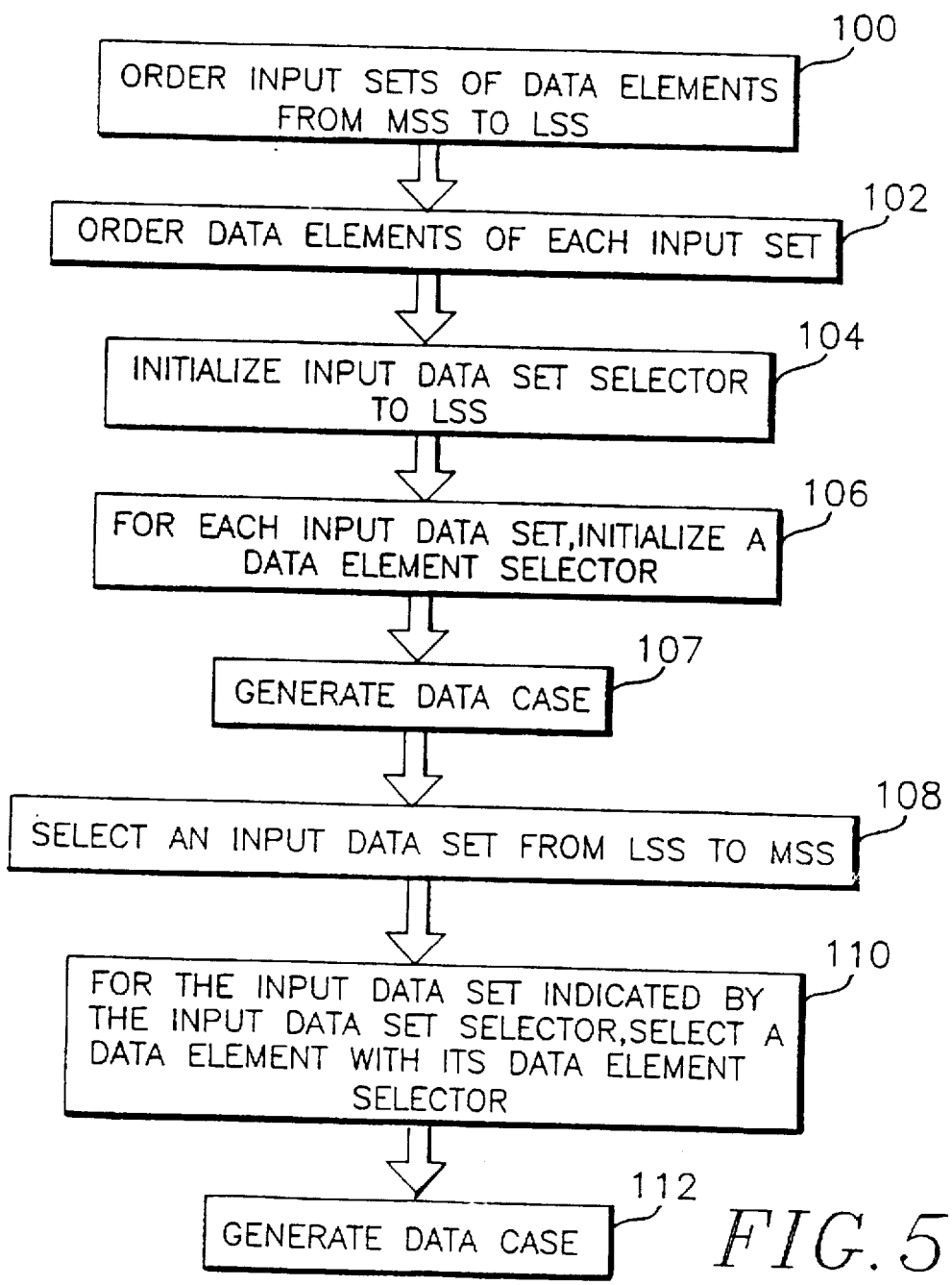
FIG. 5 is a flowchart outlining steps for a second coordinated method (grey code method) of data generation.

Referring now to FIG. 5, the grey-code method of data generation is described. The input data sets are ordered (as in step 100) from a least-significant set (LSS) to a most-significant set (MSS). The data elements of each input set are ordered (as in step 102) beginning with a first data element with a beginning index value to a last data element with an ending index value. An input data set selector is maintained to indicate the current input data set whose data element is changed in the next data case generated. The input data set selector is initialized (as in step 104). Typically, the input data set selector is initialized to the LSS. For each input data set, a data element selector is associated with a corresponding input data set and initialized (as in step 106) to select one data element from the corresponding input data set. Typically, this is the first data element of each input data set. A data case is generated (as in step 107) in which the data case comprises the data elements selected by the data element selectors. Another input data set is selected by advancing input data set selector to another input data set (as in step 108). For the input data set indicated by the input data set selector, (as in step 110) select another data element of the input data set by updating the data set selector. As in step 112, another data case is generated that comprises the data elements selected by the data element selectors. The input data selector and data element selectors may be repeatedly updated in accordance with method steps 108 and 110 and the corresponding data cases generated as in step 112.

An implementation may use different methods in selecting both a subsequent input data set and a subsequent data element from the selected input data set. One embodiment implements an incremental selection technique for the input set selector that is updated incrementally from LSS to MSS. Upon reaching the MSS, the input set selector is reset to the LSS. The input set selector sequentially cycles through each input data set from LSS to MSS. This process of cycling from LSS to MSS and resetting the input set selector is repeated as needed in generating test data.

Alternatively, an embodiment selects a input set selector using a random selection technique. The input data sets, are ordered inclusively, from "0" to "n" in which "0" corresponds to the LSS and "n" corresponds to the MSS. A random number is selected from "0" to "n" inclusively and the input set selector identifies the input data set selected that corresponds to the random number.

Figure 5A:
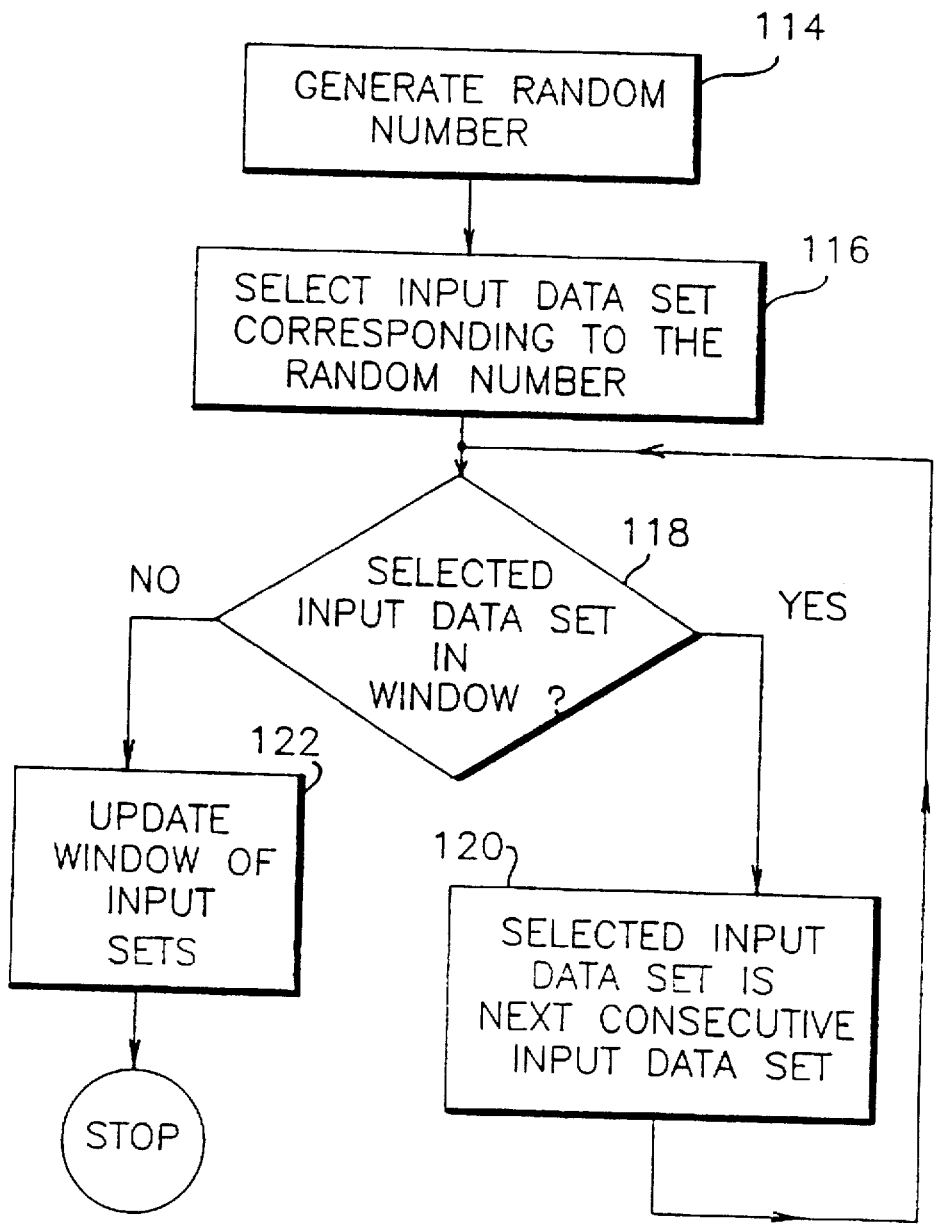
FIG. 5A is a flowchart outlining steps of a random updated selection method.

An embodiment using the foregoing random selection technique uses a heuristic to ensure that the same test data case is not generated consecutively. Referring now to FIG. 5A, one technique for ensuring that a test data case is not consecutively repeated is described. In this technique, an embodiment uses a "window size" heuristic to keep track of previous input data sets selected. The embodiment selects a "window size", a positive integer "m", representing a number of previous input data sets selected that are recorded. A random number is generated, as in step 114, and a corresponding input data set is selected, as in step 116. The corresponding input data set is compared, as in step 118, to the previous "m" input data sets in the window of saved input data sets. If the subsequent input data set is in the window, the input set selector is advanced, as in step 120, to the next consecutive input data set. The test at step 118 and the update at step 120 is repeated until an input data set is selected which is not in the window. As in step 122, the window is updated to include the current input data set.

Similarly, an embodiment implements the foregoing random selection technique illustrated in FIG. 5A to select a data element of an input data set. Note that although a variety of selection techniques may be used to select an input data set and a data element from an input data set, a preferred embodiment employs the random selection technique for selecting a data element, but may use either the random or incremental selection technique for selecting an input data set.

Using the grey-code method, the selection criteria includes the current value of the input data set selector and the data element selectors associated with the input data sets. An embodiment using the random selection technique for selecting subsequent data elements also includes one or more previously selected data elements in the selection criteria. Similarly, an embodiment using the random selection technique for selecting subsequent input data sets includes one or more previously selected input data sets.

A preferred implementation, for example in the "C" programming language, implements the input data set selector and data element selectors as pointers. In this instance, the incremental selection technique is used to select an input data set and update the input data set selector. The random selection technique is used to select a data element and update a data element selector of an input data set. Updating the input set selector and data element selector can be done in several ways depending upon the storage of the data elements and input sets. A first implementation, for example, uses address arithmetic. Alternatively, another implementation assigns the data element selector, for example, the value of another pointer currently connecting two data elements in the input data set.

A preferred implementation may use arrays to implement the input set selector and data element selectors. In one implementation using the random selection technique for selecting a data element of an input data set, a data element selector is updated by modifying the input data set index to the random number generated. The random number corresponds to an array element containing a data element.

One particular use of the grey code method of data generation is to generate data cases in which only one operand of a macro instruction varies. In an embodiment that uses the incremental set selection for the input data set selection and the random set selection for data element selection, the grey-code method can generate data cases for use in testing a data cache. A first read reference is made to a memory location not in the data cache. A data cache miss occurs. The memory location content is retrieved and stored in the data cache. A second and subsequent reference to the memory location can generate a data cache hit. The data cases can be automatically generated using the grey-code method of coordinated set selection by varying only one operand in the data. Using the following input specification with the data generator 20, an implementation generates, for example, data cases used in testing a data cache:

TEMPLATE INSTR—
    x1:{..., 'MOVl', ...}
    x2:{..., 'R2',..., 'R1', ....}
    x3:{..., '#1000', ...}
ENDTEMPLATE;
CROSS_PRODUCT [GREY_CODE] x1; x2; x3;
REPEAT (300) $INSTR;

Following are two successive test cases of macro instruction in a series of test cases that can be automatically generated by a preferred implementation using the foregoing input specification:

:
:
MOVL R2 #1000 /*  First reference to memory location 1000.
                            Data cache miss, loaded into data cache.
                            Input data set selector indicates that
                            second data set is to change in the next
                            data case generated. */
MOVL R1 #1000 /*  Second reference to memory location
                            1000. Data cache hit occurs. */
:
:

Using the preceding input specification, a TEMPLATE INSTR instruction defines an instruction template, similar to the previous sample input specification examples. Note the additional syntax 'GREY_CODE' included in the CROSS_PRODUCT statement that is used to specify the 'GREY_CODE' data generation method.

Following the input specification above are two successive test cases that may be automatically generated by a preferred embodiment. To the right hand side of the test case enclosed within "/*" and "*/" are comments included here for narrating the above test cases to set out the comments from the generated test case. The first test case, 'MOVL R2 #1000', is a macro instruction that moves a longword of data located at memory address 1000 to register 2 (R2). Assuming that the contents of memory location 1000 is currently not in the data cache, the first test case generates a data cache miss. The second instruction, 'MOVL R1 #1000', references the same memory location whose content is to be placed in register 1 (R1). However, a data cache hit occurs because the first instruction caused the content of memory location 1000 to be stored in the data cache.

The third method of coordinated set selection that will now be described is the all-change method of data generation. Generally, in this method all the data elements change for any two consecutive data sets generated.

Figure 6:
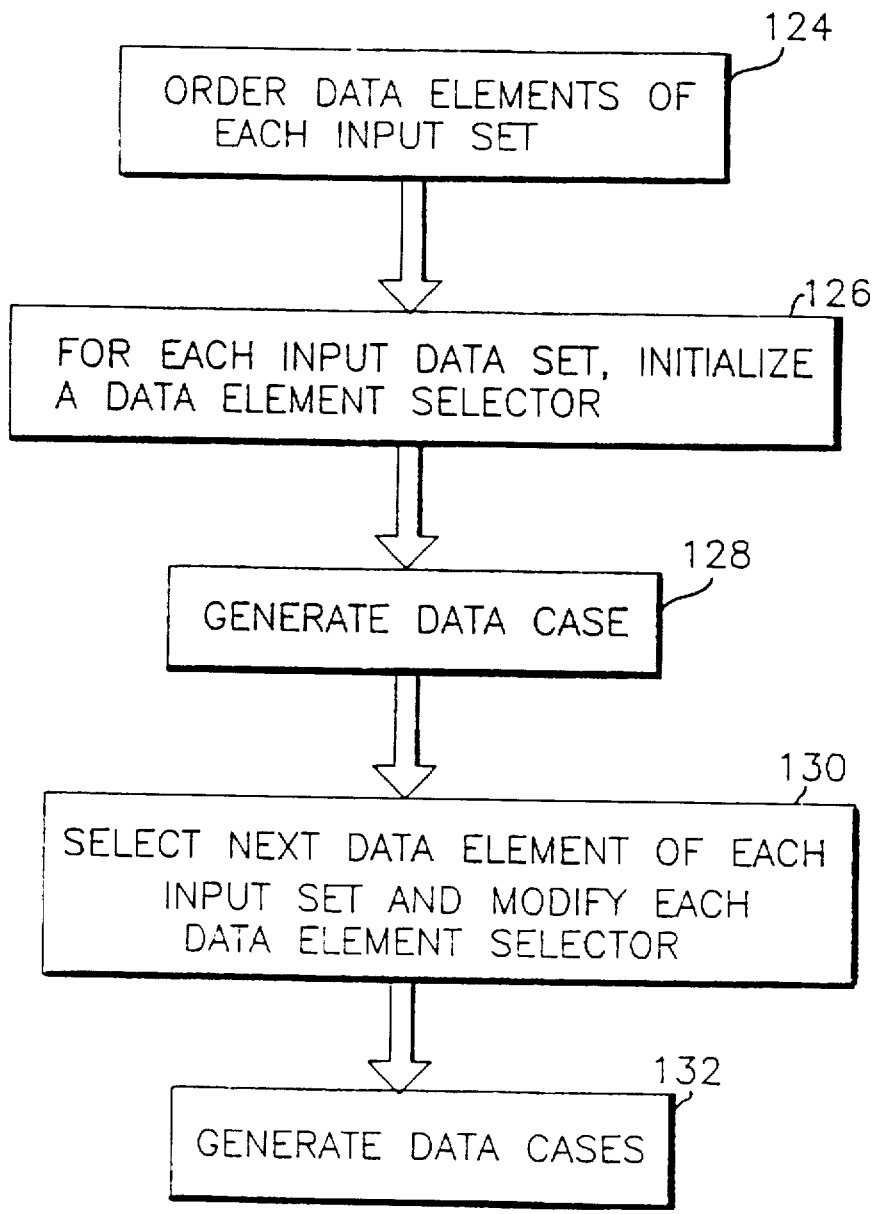
FIG. 6 is a flowchart outlining steps for a third coordinated method (all-change method) of data generation.

Referring now to FIG. 6, the all-change method will now be described. The data elements of each input data set are ordered (as in step 124). Generally, the order is from a first element with a beginning index value to a last element with an ending index value. A data element selector is associated with each input data set and initialized (as in step 126) to a data element in the associated input data set. Typically, each data element selector is initialized to the first data element in the associated input data set. The first data case is generated (as in step 128). Another data element in each input data set is selected and each data element selector is appropriately modified (as in step 130). The next data case is generated (as in step 132). Steps 130 and 132 are performed for a number of data cases as specified, for example, in the input specification.

Typically, an embodiment implements the data element selectors using one of the techniques described with the previous two methods such as, for example arrays and indices.

As with the selection of a data element with the grey code method, a variety of selection techniques may be used. An embodiment should use a selection technique, such as the foregoing random selection technique, which inherently avoids "tracking", or inherently generates repetitive patterns of date cases. For example, using the incremental selection technique with the all-change method on input data sets each having the same number of data elements will cause "tracking". Generally in this instance, the generated data may not provide adequate test coverage because various data elements from the input data sets may not be combined in a generated data case.

Therefore, an embodiment uses a selection technique, such as the random selection technique illustrated in FIG. 5A, to select a data element.

For the all-change method, the selection criteria includes the current values of the data element selectors. Additionally, one or more previous values of each data element selector corresponding to an input data set is also included in the selection criteria.

In a preferred implementation, the foregoing three (3) methods may be implemented using source code comprising the data synthesizer. As in the previous input specification used with the example illustrating the first version of the carry-out method, the carry-out method may be the default method of data generation performed when the CROSS_PRODUCT statement is as specified in the example, i.e., with no other method identifying syntax.

Each method of data generation may be implemented using syntactical variations of the CROSS_PRODUCT statement. For example, an implementation includes the carry-out method as the default method specified by the CROSS_PRODUCT statement with no other identifying syntax. To indicate that either the grey-code or all-change method of data generation is to be used, for example, in the previous sample input specification, simply include additional identifying syntax with the CROSS_PRODUCT statement as indicated below:

CROSS_PRODUCT [method_name] input_data_sets

"Method_name" is one of "GREY_CODE" or "ALL_CHANGE" corresponding, respectively, to the grey-code and all-change methods. "Input_data_sets" are input data sets as specified in a previous template statement, for example.

Other implementations may use different syntax, i.e., keywords other than 'CROSS_PRODUCT' and 'GREY_CODE', to specify a method of data generation. Other implementations may also combine one or more of the foregoing methods of data generation with other methods of data generation.

A preferred implementation embodying the invention provides both independent set selection and coordinated set selection methods providing increased testing coverage by the varied data cases generated. A preferred implementation embodying the invention provides the coordinated set selection methods by adding minimal input to the input specification. Specifically, in this implementation, adding the CROSS_PRODUCT statement to an existing input specification may be used to generate data using a coordinated set selection algorithm.

Generally, using a method of data generation providing coordinated set selection in conjunction with another independent selection method, such as RANDOM, associated with a single input set provides increased testing coverage by generating additional and new data cases. Also, in an embodiment, the additional test cases provided by the coordinated set selection method can be generated with a small amount of input in addition to the input for specifying an independent selection method.

Another preferred implementation may be achieved by modifying, for example, an existing data generation tool. The existing data generation tool is modified to include the coordinated set selection methods. Syntax is typically added to the input specification language. If an existing input specification is stored, for example, in a disk file, the existing input specification may be used to generate data with a coordination set selection method by adding, for example, one line including a CROSS_PRODUCT statement.

An advantage afforded by the coordinated set selection is new and additional test cases providing more thorough testing coverage. Coordinated set selection can be used to generate, as with the grey-code method, test data for testing a particular feature or function, such as a data cache in a computer system. The additional test cases can often be generated without much additional cost and time using existing input data sets all ready used, for example, in current independent set selection methods.

The coordinate set selection methods provide great flexibility in data generation. Specifically, the methods of data generation have a wide range of uses, such as testing hardware or software. The test data generated and the input test elements include a variety of data types and allow for the generation of varied type combinations, such as integer and string data types. Using the foregoing methods in the previously described testing approach decreases the overall cost and increases customer satisfaction through increased reliability provided by more thorough testing.

Although the foregoing preferred implementation describes a particular implementation of the data generator including a specification interpreter and a data synthesizer, different implementations are possible.

Prior art techniques include using manual data entry and data generation to provide data for use in testing hardware and software. The foregoing testing approach described herein automates data generation by minimizing the amount of required user input and specifically by reducing the manual data entry. With this testing approach, testing coverage is enhanced because additional and different sequences of test cases are generated when compared to other testing methods. Additionally, the increased testing coverage using the test data generated using the input data elements specified insures thoroughness in testing, thus, increasing product reliability and customer satisfaction. This results in reduced costs, and increased product quality and reliability.

The foregoing testing approach described provides for easily specifying input data elements in an input specification used by a data generator, such as a software tool, to generate data. The testing approach provides for specifying input data elements and neither limits the types of input data elements nor types of data generated.

The testing approach is flexible and capable of generating data type combinations. For example, test data generated can include a data case comprising both alphabetic and numeric data types in the single data case.

The techniques described for generating test data provide thorough testing coverage within a reasonable period of time without requiring extensive computer resources. Rather, the using the data generation techniques in the foregoing testing approach provides for generating test data that affords adequate testing coverage for a majority of possible combinations using an amount of generated data that can be executed in a reasonable amount of testing time.

Current methods of generating data frequently produce fixed sequences of data which may also omit certain combinations of data elements in a single data case. The coordinated set selection methods generate test data which does not inherently omit combinations of input data elements in its generated sequence of test cases. Furthermore, the coordinated set selection methods provide the ability to alter a sequence and produce a different ordering of test cases for the same input data elements providing a new additional testing perspective for the same input test elements thereby increasing test coverage without requiring respecification of input data elements.

Existing methods tend to focus upon the combination of data elements in each data case rather than relative proximity of two or more data cases to one another in a data sequence. Generally, thorough testing also requires generated data to consider previous and successive test cases, as provided by the coordinated set selection methods.

The foregoing technique affords a flexible and efficient way of automated data generation in a cost and time efficient manner. Additionally, this is accomplished without adversely restricting the type of data generated, or encumbering the tester with excessive manual data entry.

Having described preferred embodiments of the invention, it will now become apparent to those of skill in the art that other embodiments incorporating its concepts may be provided. It is felt therefore that this invention should not be limited to the disclosed embodiments but rather should be limited only by the spirit and scope of the appended claims.

What is claimed is:

1. A method executed in a computer system for generating test data, said method comprising the steps of:

ordering two or more input data sets from a least-significant data set to a most-significant data set, each of said input data sets comprising one or more input data elements ordered from a first input data element with a beginning index value to a last input data element with an ending index value;

associating an index with a plurality of input data sets;

selecting an input data element from each of said input data sets in accordance with selection criteria, said input data element selected being identified by said index associated with said input data set comprising said input data element selected; and generating an output data set comprising said input data elements selected and identified by said index values associated with said plurality of input data sets, and wherein said step of selecting further includes the steps of:

selecting one of said input data sets identified by an input data set selector;

randomly selecting, as identified by an index associated with one of said input data sets, a first input data element from said input data set selected;

comparing said first input data element to each of said data elements in a window set, each input data element of the window set identifying a previously selected input data element of said input data set currently identified by said input set selector;

selecting, if said first data element matches one of said data elements in said window set, a second input data element from said input data set currently identified by said input set selector and updating said window set to include said second input data element; and selecting, if said first data element does not match one of said data elements in said window set, said first data element and updating said window set to include said first input data element, said selection criteria including said index associated with one of said input data sets, said window set comprising one or more input data elements, and said input data set selector.

2. The method of claim 1 wherein said step of selecting comprises the steps of:

incrementing a first index associated with the least-significant input data set and, upon said first index being equal to said ending index value, producing a carry-out value and resetting said first index to said beginning index value; and incrementing, in response to said carry-out value, a second index corresponding to an index associated with the next-least significant input data set with said first and second indices and said carry-out value comprising said selection criteria.

3. The method of claim 2 wherein said method steps of incrementing said first index, incrementing said second index, and generating an output data set are repeatedly performed using other indices associated with other of said input data sets, depending upon said associated index values, and wherein, if a third index corresponds to a first of said input data sets and a fourth index corresponds to a second of said input data sets, said first input data set being of a lesser significance than said second input data set, said third index varies faster than said fourth index.

4. The method of claim 1, wherein said step of selecting one of said input data sets using said input data set selector includes advancing said input set selector sequentially to another input data set.

5. The method of claim 1, wherein said step of selecting one of said input data sets identified by an input data set selector further comprises:

randomly selecting a second input data set from said input data sets;

comparing said second input data set to each of said input data sets comprising another window set of one or more input data sets, each input data set of said other window set identifying a previously selected input data set;

selecting, if said second input data set matches one of said input data sets in said other window set, a third input data set and updating said other window set to include said third input data set; and selecting, if said second input data set does not match one of said input data sets in said other window set, said second input data set and updating said other window set to include said second input data set, said selection criteria further including said other window set.

6. The method of claim 1 wherein said step of selecting further comprises the steps of:

randomly selecting a first input data element from each of said input data sets, said first input data element identified by an index associated with said each input data set;

comparing said first input data element to each of said input data elements comprising a window set associated with said each input data set;

selecting, if said first input data element matches one of said input data elements in said window set associated with said each input data set, a second input data element and updating said window set associated with said each input data set to include said second input data element; and selecting, if said first input data element does not match one of said input data elements in said window set associated with said each input data set, said first input data element and updating said window set associated with said each input data set to include said first input data element, said selection criteria including said indices, each of said indices being associated with one of said input data sets, and said window set associated with each of said input data sets identifying one or more previously selected input data elements from the associated input data set.

7. The method of claim 1 further including the step of specifying said input data sets using an input specification language.

8. The method of claim 7 wherein said input specification language includes a statement used to identify methods of data generation.

9. The method of claim 7 wherein said input specification language includes a statement to output and format data.

10. The method of claim 7 wherein said input specification language includes a statement to define an input data set with a first element of a first data type and a second element of a second data type different from the first data type.

11. The method of claim 1 wherein said input data sets are specified in an input specification file, and wherein said output data set is stored in a file.

12. A method of generating test data executed in a computer system, the method comprising the steps of:

producing an input specification identifying one or more input data sets, each data set comprising one or more input data elements, said input specification identifying a coordinated set selection method of data generation to be performed using a portion of said input data sets, said coordinated set selection method of data generation coordinating one or more input data elements each belonging to one of said input data sets;

analyzing said input specification to produce analysis information describing said method of generation and said input data sets used in said coordinated set selection method;

generating one or more output data cases using said analysis information; and updating said analysis information producing updated analysis information reflecting said output data cases generated, and wherein said coordinated set selection method of data generation is a carry-out method of data generation further comprising the steps of:

ordering said input data sets from a least significant data set to a most-significant data set, each of said input data sets comprising one or more input data elements ordered from a first data element with a beginning index value to a last data element with an ending index value;

associating an index with each of said input data sets;

forming a counter comprising the indices;

incrementing a first index associated with the least-significant input data set and, upon said first index being equal to said ending index value, producing a carry-out value and resetting said first index to said beginning index value;

incrementing, in response to said carry-out value, a second index corresponding to an index associated with the next-least significant input data set; and generating an output data set comprising the input data elements identified by index values comprising the counter.

13. The method of claim 12 wherein said step of analyzing said input specification includes the sub-steps of parsing and semantic processing.

14. The method of claim 13 wherein said parsing is performed by a specification analyzer and said step of generating output data cases is performed by a data synthesizer.

15. The method of claim 12 further including the step of generating one or more other data cases using said updated analysis information.

16. The method of claim 12, wherein said input specification identifies an independent set selection method to independently select input data elements from one of said input data sets.

17. A memory comprising:

code for ordering two or more input data sets from a least-significant data set to a most-significant data set, each of said input data sets comprising one or more input data elements ordered from a first input data element with a beginning index value to a last input data element with an ending index value;

code for associating an index with each of said input data sets;

code for selecting an input data element from each of said input data sets in accordance with selection criteria, said input data element selected being identified by said index associated with said input data set comprising said input data element selected; and code for generating an output data set comprising said input data elements selected and identified by said one or more index values, and wherein said code for selecting an input data element further comprises:

code for selecting one of said input data sets identified by an input data set selector;

code for randomly selecting, as identified by an index associated with one of said input data sets, a first input data element from said input data set selected;

code for comparing said first input data element to each of said input data elements in a window set, each input data element of the window set identifying a previously selected input data element of said input data set currently identified by said input set selector;

code for selecting a second input data element from said input data set currently identified by said input set selector and code for updating said window set to include said second input data element which is executed if said input first data element matches one of said input data elements in said window set; and code for selecting said first input data element and code for updating said window set to include said first input data element which is executed if said first input data element does not match one of said input data elements in said window set, said selection criteria including said index, said window set comprising one or more input data elements, and said input data set selector.

18. The memory of claim 17, wherein said code for selection further comprises:

code for incrementing said first index associated with the least-significant input data set and, upon said first index being equal to said ending index value, producing a carry-out value and resetting said first index to said beginning index value; and code, executed in response to said code for incrementing said first index, for incrementing a second index corresponding to an index associated with the next-least significant input data set with said first and second indices and said carry-out value comprising said selection criteria.

19. The memory of claim 18, wherein said code for incrementing said first index, code for incrementing said second index, and code for generating an output data set using other indices associated with other of said input data sets, depends upon said associated index values, and wherein, if a third index corresponds to a first of said input data sets and a fourth index corresponds to a second of said input data sets, said first input data set being of a lesser significance than said second input data set, said third index varies faster than said fourth index.

20. The memory of claim 17, wherein said code for selecting one of said input data sets using said input data set selector includes code for advancing said input set selector sequentially to another input data set.

21. The memory of claim 17, wherein said code for selecting one of said input data sets using said input data set selector further comprises:

code for randomly selecting a second input data set from said input data sets;

code for comparing said second input data set to each of said input data sets comprising said other window set, each input data set of said other window set identifying a previously selected input data set;

code for selecting a third input data set and code for updating said other window set to include said third input data set executed if said second input data set matches one of said input data sets in said other window set; and code for selecting said second input data set and code for updating said other window set to include said second input data set executed if said second input data set does not match one of said input data sets in said other window set, said selection criteria further including said other window set.

* * * * *